US012712044B2

(12) United States Patent
Xu et al.

(10) Patent No.: US 12,712,044 B2
(45) Date of Patent: Aug. 18, 2026

(54) DUAL-READ DATA INTEGRITY SCAN IN A MEMORY SUB-SYSTEM

(71) Applicant: Micron Technology, Inc., Boise, ID (US)

(72) Inventors: Zhongguang Xu, San Jose, CA (US); Hanping Chen, San Jose, CA (US); Peng Zhang, Los Altos, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 18/774,799

(22) Filed: Jul. 16, 2024

(65) Prior Publication Data

US 2025/0104789 A1 Mar. 27, 2025

Related U.S. Application Data

(60) Provisional application No. 63/584,765, filed on Sep. 22, 2023.

(51) Int. Cl.
*G11C 29/12* (2006.01)

(52) U.S. Cl.
CPC .............................. *G11C 29/12005* (2013.01)

(58) Field of Classification Search
CPC ............ G11C 29/12005; G11C 29/021; G11C 29/028; G11C 2029/0409; G11C 29/52
USPC .......................................................... 714/719
See application file for complete search history.

(56) References Cited

U.S. PATENT DOCUMENTS

| | | | | |
|---|---|---|---|---|
| 9,136,011 | B2 * | 9/2015 | Weathers | G11C 11/5628 |
| 9,147,483 | B2 * | 9/2015 | Yoon | G11C 16/3422 |
| 2014/0281766 | A1 * | 9/2014 | Yang | G11C 11/56 714/721 |
| 2016/0147582 | A1 * | 5/2016 | Karakulak | G06F 11/079 714/37 |

(Continued)

FOREIGN PATENT DOCUMENTS

KR 20220066815 A 5/2022

OTHER PUBLICATIONS

International Search Report and Written Opinion for International Application No. PCT/US2024/047844, mailed Dec. 13, 2024, 8 Pages.

*Primary Examiner* — James C Kerveros
(74) *Attorney, Agent, or Firm* — Lowenstein Sandler LLP

(57) ABSTRACT

A processing device in a memory sub-system performs a first data integrity scan on a block of a memory device to determine a first combined reliability statistic of memory cells in the block associated with a first program level and a second program level, and performs, using a predetermined read level offset corresponding to one of the first program level or the second program level, a second data integrity scan on the block of the memory device to determine a second combined reliability statistic of the memory cells in the block associated with the first program level and the second program level. The processing device determines a difference between the first combined reliability statistic and the second combined reliability statistic and, responsive to the difference between the first combined reliability statistic and the second combined reliability statistic satisfying a threshold criterion, performs a corrective action on the block of the memory device.

20 Claims, 5 Drawing Sheets

(56) References Cited

U.S. PATENT DOCUMENTS

| | | | | |
|---|---|---|---|---|
| 2019/0065315 | A1 | 2/2019 | Shirley, Jr. et al. | |
| 2019/0190541 | A1* | 6/2019 | Tao | G06F 11/1012 |
| 2020/0218599 | A1 | 7/2020 | Elliott et al. | |
| 2021/0183456 | A1 | 6/2021 | Muchherla et al. | |
| 2023/0062445 | A1 | 3/2023 | Lee et al. | |

* cited by examiner

400

Exta-page Scan of L3 and L7
for Program Complete Detection

Read level offset

DUAL-READ DATA INTEGRITY SCAN IN A MEMORY SUB-SYSTEM

RELATED APPLICATIONS

This application claims the benefit of priority from U.S. Provisional Application No. 63/584,765, filed Sep. 22, 2023, the entire contents of which are hereby incorporated by reference herein.

TECHNICAL FIELD

Embodiments of the disclosure relate generally to memory sub-systems, and more specifically, relate to a dual-read data integrity scan in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 illustrates a dual-read extra-page scan for program complete detection in a memory sub-system in accordance with some embodiments of the present disclosure.

DETAILED DESCRIPTION

Figure 1:
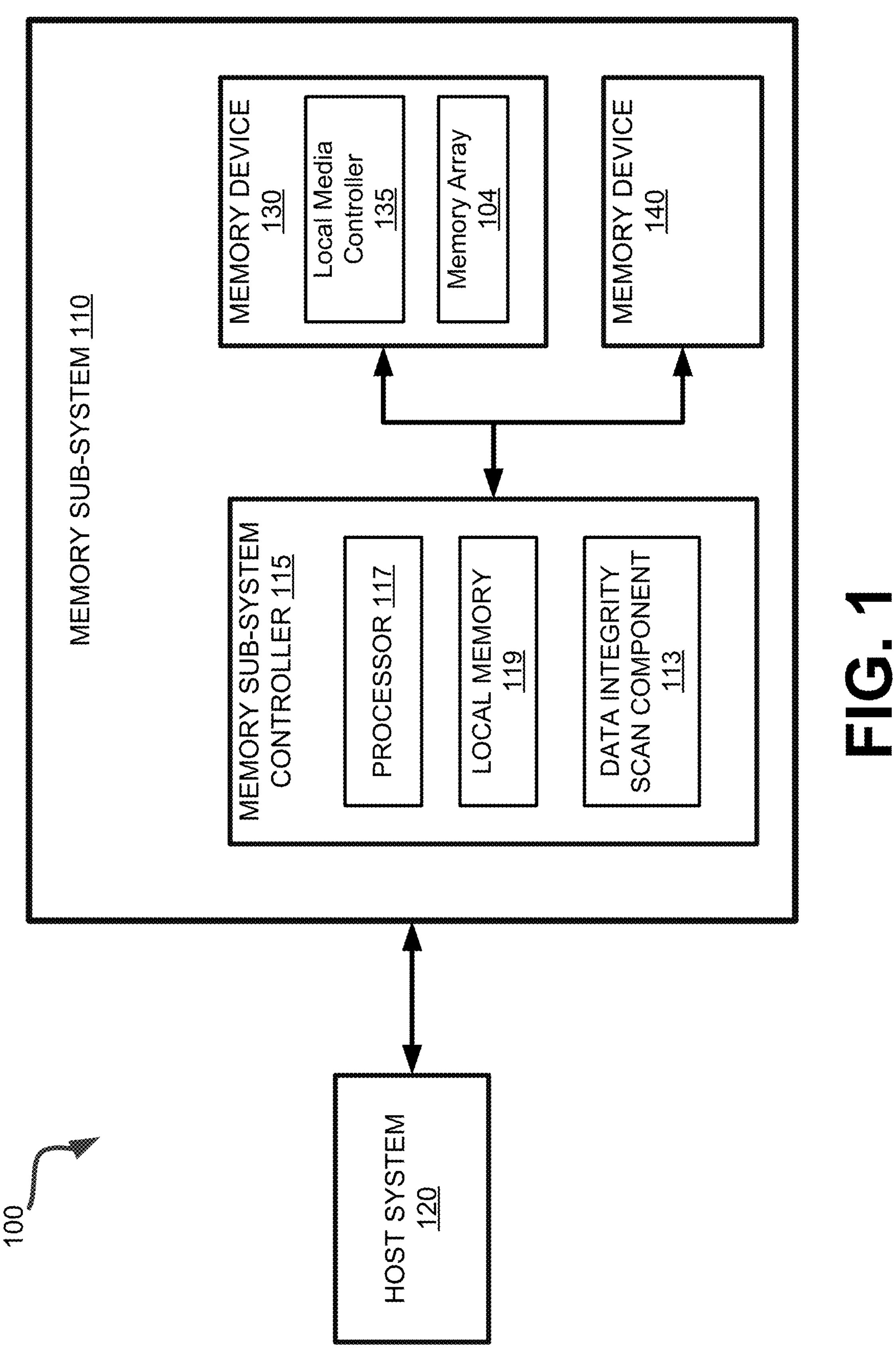
FIG. 1 illustrates an example computing system that includes a memory sub-system in accordance with some embodiments of the present disclosure.

Aspects of the present disclosure are directed to a dual-read data integrity scan in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. When data is written to a memory cell of the segment for storage, the memory cell can deteriorate. Accordingly, each memory cell of the segment can handle a finite number of write operations performed before the memory cell is no longer able to reliably store data. The error rate associated with data stored at the data block can increase due to a number of factors, including read disturb, slow charge loss, the passage of time, change in temperature, asynchronous power loss etc. Therefore, at certain intervals, the memory sub-system can perform a data integrity check (also referred to herein as a "scan") to verify that the data stored at a segment does not include any errors. During the data integrity check, one or more reliability statistics are determined for data stored at the block. One example of a reliability statistic is raw bit error rate (RBER). The RBER corresponds to a number of bit errors per unit of time that the data stored at the block experiences. The data integrity check, for example, can take the form of a read disturb scan, triggered by a threshold number of read operations having been performed, or a program completion scan, triggered when power is restored after an asynchronous power loss event occurs during a program operation.

To perform a data integrity check, certain memory devices are configured to read a certain page of data, which may include memory cells at two different program levels. For example, if a lower-page read is performed, the memory sub-system reads memory cells from a block of the memory device programmed to program level 1 (L1) and program level 5 (L5). Similarly, if an extra-page read is performed, the memory sub-system reads memory cells from the block programmed to program level 3 (L3) and program level 7 (L7). Thus, the reliability statistic determined from either the lower-page read or the extra page read is representative of memory cells read from at least two different program levels. Depending on the specific use case, however, the reliability statistic associated with memory cells from only one of the multiple program levels may be useful in determining whether corrective action is required. For example, when performing a read disturb scan to detect the presence of read disturb in a block of the memory device, only the reliability statistics associated with lower program levels (e.g., program level 1 (L1)) may be informative of whether the block needs to be refreshed. Similarly, when performing program completion scan, only the reliability statistics associated with higher program levels (e.g., program level 7 (L7)) may be informative of whether the data needs to be reprogrammed to another block. These memory devices, however, do not have the ability to distinguish the contributions of the reliability statistics from the multiple program levels read together in a given page read. Accordingly, if the data integrity check indicates that the reliability statistic for a block or other segment (i.e., the combined reliability statistic associated with multiple program levels) exceeds a threshold value, indicating a high error rate associated with data stored at the block, then the data stored at the block may be relocated to a new block of the memory sub-system (also referred to herein as "folding") or the data can be re-programmed to either the same or a different block unnecessarily. This ties up system resources that could be used for other operations, and adds additional wear to the physical media used in the memory sub-system.

Aspects of the present disclosure address the above and other deficiencies by implementing a dual-read data integrity scan in a memory sub-system. In one embodiment, a first data integrity scan (e.g. either a read disturb scan or a program completion scan) is performed on a block of a memory device by determining a combined reliability statistic associated with two or more program levels. If it is determined that the combined reliability statistic fails to satisfy a scan criterion, a second data integrity scan can be initiated. In one embodiment, a read level offset value is applied to adjust (e.g., decrease) the read voltage applied to memory cells associated with one of the two or more program levels, while the read voltage applied to the memory cells associated with any remaining program levels remains the same as was used in the first data integrity scan. The memory sub-system can determine a difference between a combined reliability statistic from the second data integrity scan and the combined reliability statistic from the first reliability scan. This difference should be attributable only to the read level offset value applied to one program level, and should eliminate any portion of the combined reliability statistic attributable to the other program level. If the difference satisfies a threshold criterion (e.g., is greater than or equal to a threshold value), the memory sub-system can take corrective action for the block, such as folding the block or reprogramming the data to another block in the memory device.

Advantages of the approach described herein includes, but is not limited to, improved performance in the memory sub-system. The dual-read data integrity scan allows the memory sub-system to perform the current page read operation on memory cells at two different program levels, while determining the reliability statistic contribution (e.g., RBER) for memory cells at only one of the program levels. This enables the memory sub-system to detect the presence of read disturb or program completion and take any correction action that is needed. By accurately detecting the presence of these conditions, without implementing design changes to current memory devices, the memory sub-system can prevent unnecessary folding and re-program operations, thereby preserving system resources and improving memory device endurance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135)

embodied thereon. In some embodiments, one or more components of memory sub-system 110 can be omitted.

In one embodiment, the memory sub-system 110 includes a data integrity scan component 113 that can perform dual-read data integrity scan on memory device 130. As noted above, the dual-read data integrity scan can include either a read disturb scan or a program completion scan, depending on the implementation. In either case, data integrity scan component 113 performs a first data integrity scan on a block of memory device 130 to determine a first combined reliability statistic of memory cells in the block associated with a first program level and a second program level. For example, if a lower-page read is performed, the memory sub-system reads memory cells from a block of the memory device programmed to program level 1 (L1) and program level 5 (L5). Similarly, if an extra-page read is performed, the memory sub-system reads memory cells from the block programmed to program level 3 (L3) and program level 7 (L7). In other embodiments some other page of data, including memory cells programmed to different program levels can be read. Although the examples included herein are described with respect to TLC memory, it should be appreciated that in other embodiments, the same principles may be applicable to other types of memory, such as QLC memory, for example. Data integrity scan component 113 further performs, using a predetermined read level offset corresponding to one of the first program level or the second program level, a second data integrity scan on the block of memory device 130 to determine a second combined reliability statistic of the memory cells in the block associated with the first program level and the second program level. Data integrity scan component 113 determines a difference between the first combined reliability statistic and the second combined reliability statistic and, responsive to the difference between the first combined reliability statistic and the second combined reliability statistic satisfying a threshold criterion, performs a corrective action on the block of memory device 130. Further details with regard to the operations of data integrity scan component 113 are described below.

Figure 2:
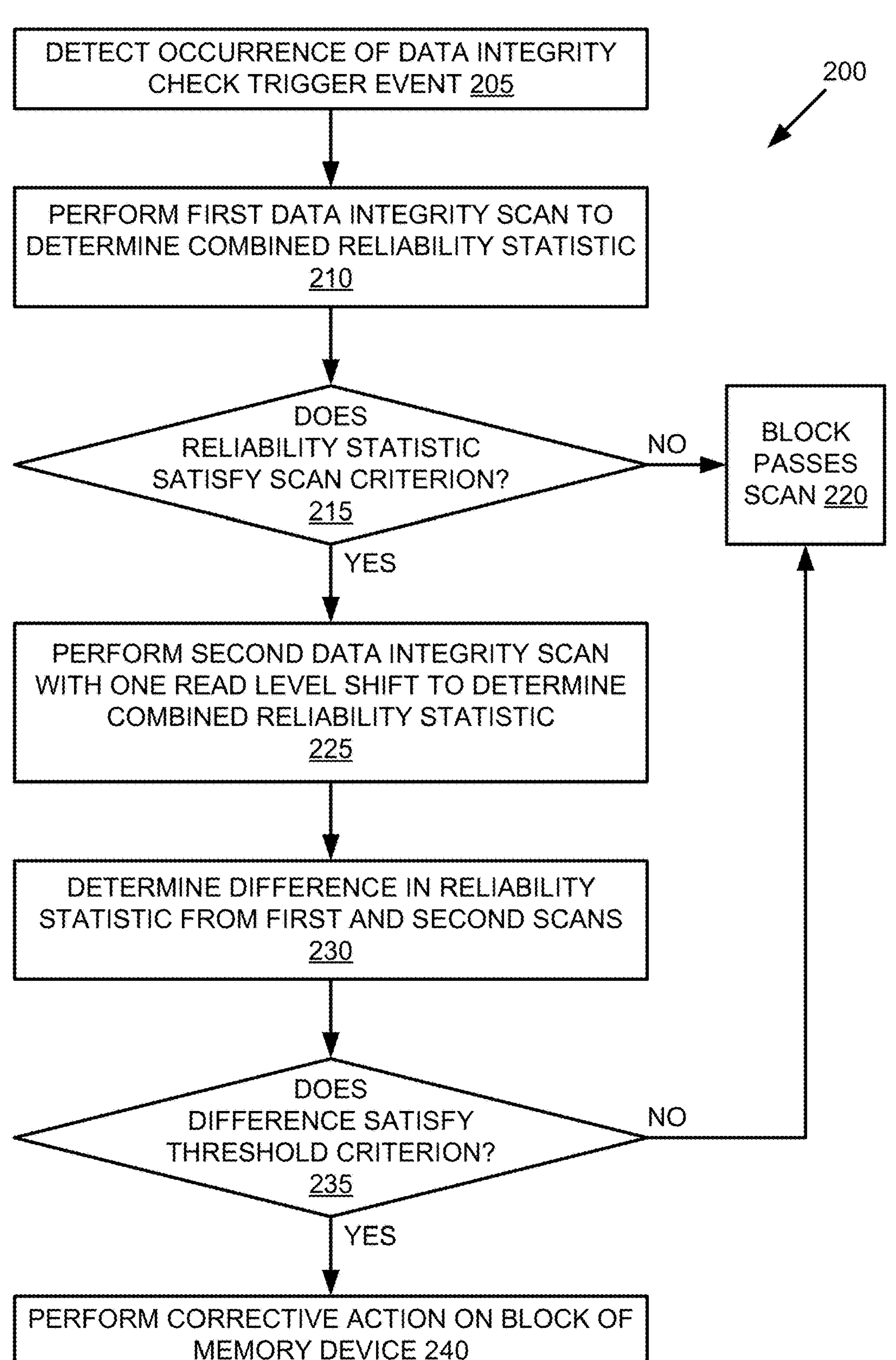
FIG. 2 is a flow diagram of an example method of performing a dual-read data integrity scan in a memory sub-system in accordance with some embodiments of the present disclosure.

FIG. 2 is a flow diagram of an example method of performing a dual-read data integrity scan in a memory sub-system in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by data integrity scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing logic (e.g., data integrity scan component 113) detects an occurrence of a data integrity check trigger event. Depending on the embodiment, the data integrity check trigger event comprises at least one of an expiration of a threshold period of time since a previous data integrity check, an occurrence of a threshold number of read operations or program-erase cycles in the memory sub-system since the previous data integrity check, or the occurrence of an asynchronous power loss event while a program operation is being performed in memory sub-system 110.

At operation 210, responsive to the occurrence of the data integrity check trigger event, the processing logic performs a first data integrity scan on a block of the memory device to determine a first combined reliability statistic of memory cells in the block associated with a first program level and a second program level. Depending on the embodiment, and depending on what trigger event has occurred, the first data integrity scan can be part of a read disturb scan to detect the presence of read disturb in the memory device 130 or part of a program completion scan to determine whether a previously initiated program operation was completed or interrupted by an asynchronous power loss event.

Figure 3:
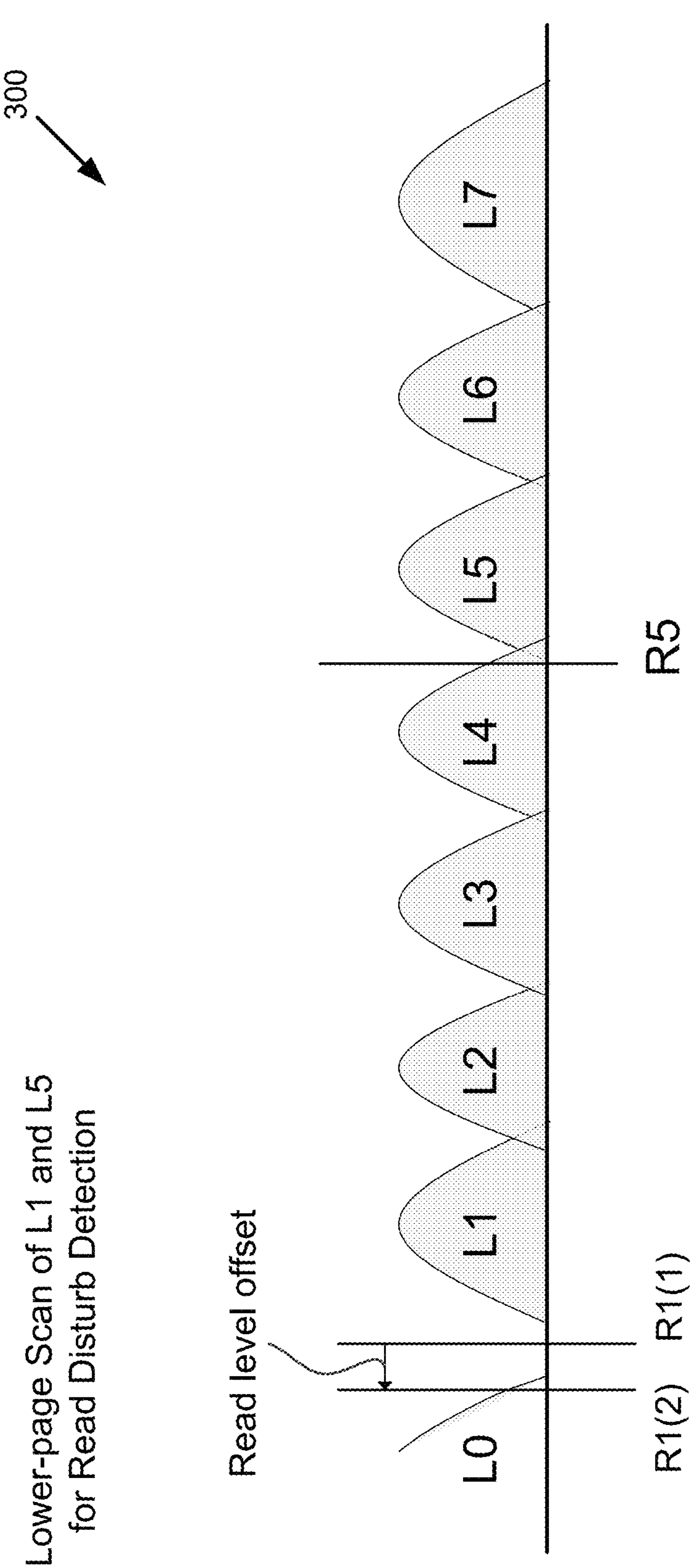
FIG. 3 illustrates a dual-read lower-page scan for read disturb detection in a memory sub-system in accordance with some embodiments of the present disclosure.

As illustrated in FIG. 3, a read disturb scan can include a lower-page read operation 300, where the first program level is program level 1 (L1), for example, and the second program level is program level 5 (L5), for example. During the first data integrity scan, default read voltages corresponding to the first program level and the second program level can be used. For example, data integrity scan component 113 can cause a first read voltage R1(1) to be applied to the wordlines of memory array 104 that are associated with memory cells programed to program level 1 (L1) and a second read voltage R5 to be applied to the wordlines of memory array 104 that are associated with memory cells programed to program level 5 (L5). These default read voltages can be used to determine a first combined reliability statistic of the memory cells associated with program level 1 (L1) and program level 5 (L5). The first combined reliability statistic can include a total error count, a raw bit error rate (RBER), or some other statistic. However, data integrity scan component 113 is not able to identify the individual contributions of each program level to the combined reliability statistic. Since only the contribution of program level 1 (L1) is relevant to detecting read disturb in the block, data integrity scan component 113 cannot reliably determine whether read disturb is present based on the first data integrity scan alone.

Figure 4:
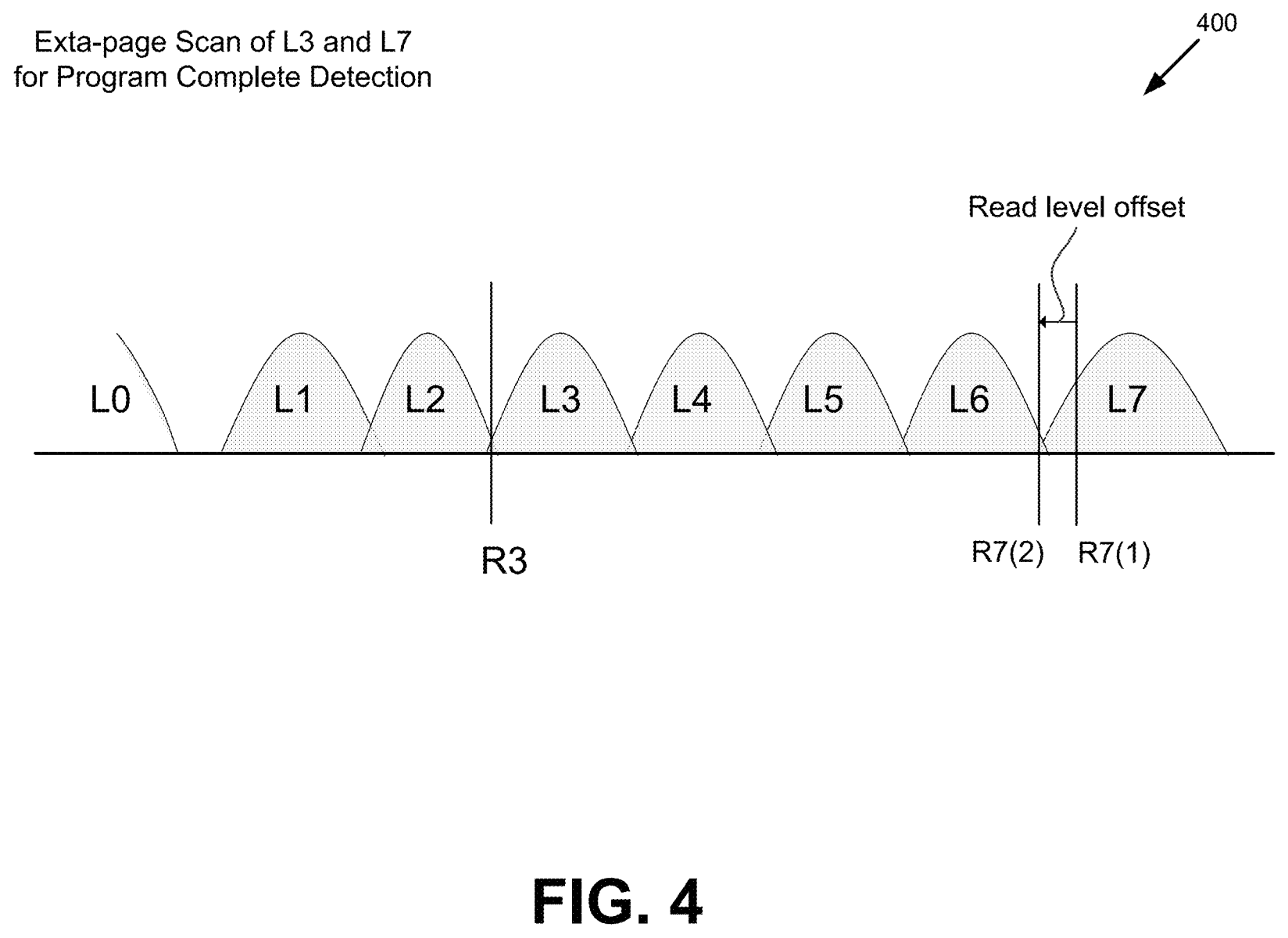

As illustrated in FIG. 4, a program completion scan can include an extra-page read operation 400, where the first program level is program level 7 (L7), for example, and the second program level is program level 3 (L3), for example. During the first data integrity scan, default read voltages corresponding to the first program level and the second program level can be used. For example, data integrity scan component 113 can cause a first read voltage R7(1) to be applied to the wordlines of memory array 104 that are associated with memory cells programed to program level 7 (L7) and a second read voltage R3 to be applied to the wordlines of memory array 104 that are associated with memory cells programed to program level 3 (L3). These default read voltages can be used to determine a first combined reliability statistic of the memory cells associated with program level 7 (L7) and program level 3 (L3). The first combined reliability statistic can include a total error count, a raw bit error rate (RBER), or some other statistic. However, data integrity scan component 113 is not able to identify the individual contributions of each program level to the combined reliability statistic. Since only the contribution of program level 7 (L7) is relevant to detecting whether the program operation was completed, data integrity scan component 113 cannot reliably determine whether the program operation was completed based on the first data integrity scan alone.

Referring again to FIG. 2, at operation 215, the processing logic determines whether the first combined reliability statistic satisfies a scan threshold criterion. In one embodiment, data integrity scan component 113 compares the first combined reliability statistic to a low threshold value. If the first combined reliability statistic is greater than or equal to the low threshold value, data integrity scan component 113 determines that the first combined reliability statistic satisfies the threshold criterion. If the first combined reliability statistic is less than the low threshold value, data integrity scan component 113 determines that the first combined reliability statistic does not satisfy the threshold criterion. For example, if the first combined reliability statistic has a value of 220 and the low threshold value is 180, data integrity scan component 113 determines that the threshold criterion is satisfied. In one embodiment, data integrity scan component 113 further compares the first combined reliability statistic to a high threshold value, which is larger than the low threshold value. Depending on whether the first combined reliability statistic is greater than, equal to, or less than the high threshold value, data integrity scan component 113 can take corresponding action. For example, in one embodiment, if the first combined reliability statistic is greater than or equal to the high threshold value, data integrity scan component 113 can determine that the first data integrity scan (e.g., a program completion scan) has failed, and can designate the block for future garbage collection and reprogram the data to another block of memory device 130.

Responsive to the first combined reliability statistic not satisfying the scan threshold criterion, at operation 220, the processing logic determines that the block passes the first data integrity scan. Since the first combined reliability statistic is below the low threshold value, data integrity scan component 113 need not perform a second data integrity scan and can proceed with additional memory operations.

Responsive to the first combined reliability statistic satisfying the scan threshold criterion, at operation 225, the processing logic performs a second data integrity scan on the block of the memory device to determine a second combined reliability statistic of the memory cells in the block associated with the first program level and the second program level. In one embodiment, upon determining that the first combined reliability statistic is greater than the low threshold value (and in some embodiments, lower than the high threshold value), data integrity scan component 113 can initiate the second data integrity scan. In one embodiment, data integrity scan component 113 performs a read operation of the memory cells associated with the same two program levels, where at least one read voltage is modified by a predetermined read level offset corresponding to one of the first program level or the second program level.

As illustrated in FIG. 3, during the second data integrity scan, data integrity scan component 113 can cause a modified first read voltage R1(2) to be applied to the wordlines of memory array 104 that are associated with memory cells programed to program level 1 (L1) and the same read voltage R5 as was used during the first data integrity scan to be applied to the wordlines of memory array 104 that are associated with memory cells programed to program level 5 (L5). In one embodiment, the first read voltage R1(1) is decreased by the predetermined read level offset amount to form the modified first read voltage R1(2). These read voltages can be used to determine a second combined reliability statistic of the memory cells associated with program level 1 (L1) and program level 5 (L5).

As illustrated in FIG. 4, during the second data integrity scan, data integrity scan component 113 can cause a modified first read voltage R7(2) to be applied to the wordlines of memory array 104 that are associated with memory cells programed to program level 7 (L7) and the same read voltage R3 as was used during the first data integrity scan to be applied to the wordlines of memory array 104 that are associated with memory cells programed to program level 3 (L3). In one embodiment, the first read voltage R7(1) is decreased by the predetermined read level offset amount to form the modified first read voltage R7(2). These read voltages can be used to determine a second combined reliability statistic of the memory cells associated with program level 7 (L7) and program level 3 (L3).

Referring again to FIG. 2, at operation 230, the processing logic determines a difference between the first combined reliability statistic and the second combined reliability statistic. In one embodiment, data integrity scan component 113 subtracts the first combined reliability statistic from the second combined reliability statistic, or vice versa, to determine the difference. Since the same read voltage was applied to the second program level during both the first data integrity scan and the second data integrity scan, the contribution to the combined reliability statistic associated with the second program level will be the same. Thus, any difference between the first combined reliability statistic and the second combined reliability statistic will be based on the contribution associated with the first program level, to which different read voltages were applied during the first data integrity scan and the second data integrity scan. Since the contribution of the first program level is relevant to detecting either read disturb or program completion in the block, data integrity scan component 113 can reliably determine whether read disturb is present or whether the program operation was completed based on the difference between the first combined reliability statistic and the second combined reliability statistic.

At operation 235, the processing logic determines whether the difference between the first combined reliability statistic and the second combined reliability statistic satisfies a threshold criterion. In one embodiment, data integrity scan component 113 compares the difference to a threshold value. If the difference is greater than or equal to the threshold value, data integrity scan component 113 determines that the difference satisfies the threshold criterion. If the difference is less than the threshold value, data integrity scan component 113 determines that the difference does not satisfy the threshold criterion. For example, if the first combined reliability statistic has a value of 220 and the second combined reliability statistic has a value of 820, data integrity scan component 113 determines that difference is 600. If the threshold value is 50, data integrity scan component 113 determines that the threshold criterion is satisfied. Such a large difference between the first combined reliability statistic and the second combined reliability statistic can representative of an increased error rate or error count associated with the first program level when the read voltage offset is applied during the second data integrity scan, which suggests that the corresponding voltage distribution of memory cells associated with the first program level has shifted relative to the default read voltage. If the difference between the first combined reliability statistic and the second combined reliability statistic is relatively small, this suggests that the corresponding voltage distribution of memory cells associated with the first program level has not shifted significantly relative to the default read voltage.

Responsive to the difference between the first combined reliability statistic and the second combined reliability statistic not satisfying the threshold criterion, at operation 220, the processing logic determines that the block passes the dual-read data integrity scan. Since the difference between the first combined reliability statistic and the second combined reliability statistic is below the threshold value, data integrity scan component 113 need not take any corrective action and can proceed with additional memory operations.

Responsive to the difference between the first combined reliability statistic and the second combined reliability statistic satisfying the threshold criterion, at operation 240, the processing logic performs a corrective action on the block of the memory device. Since the difference between the first combined reliability statistic and the second combined reliability statistic is greater than or equal to the threshold value, data integrity scan component 113 can determine either that read disturb is present or that the previous program operation was not fully completed, and thus, that some correction action is needed. In one embodiment, for a read disturb scan, the corrective action comprises folding data in the block to another block of the memory device 130. For a program completion scan, the corrective action comprises marking the block for garbage collection and reprogramming data from the block to another block of the memory device 130. In other embodiments, different and/or additional corrective actions can be performed.

Figure 5:
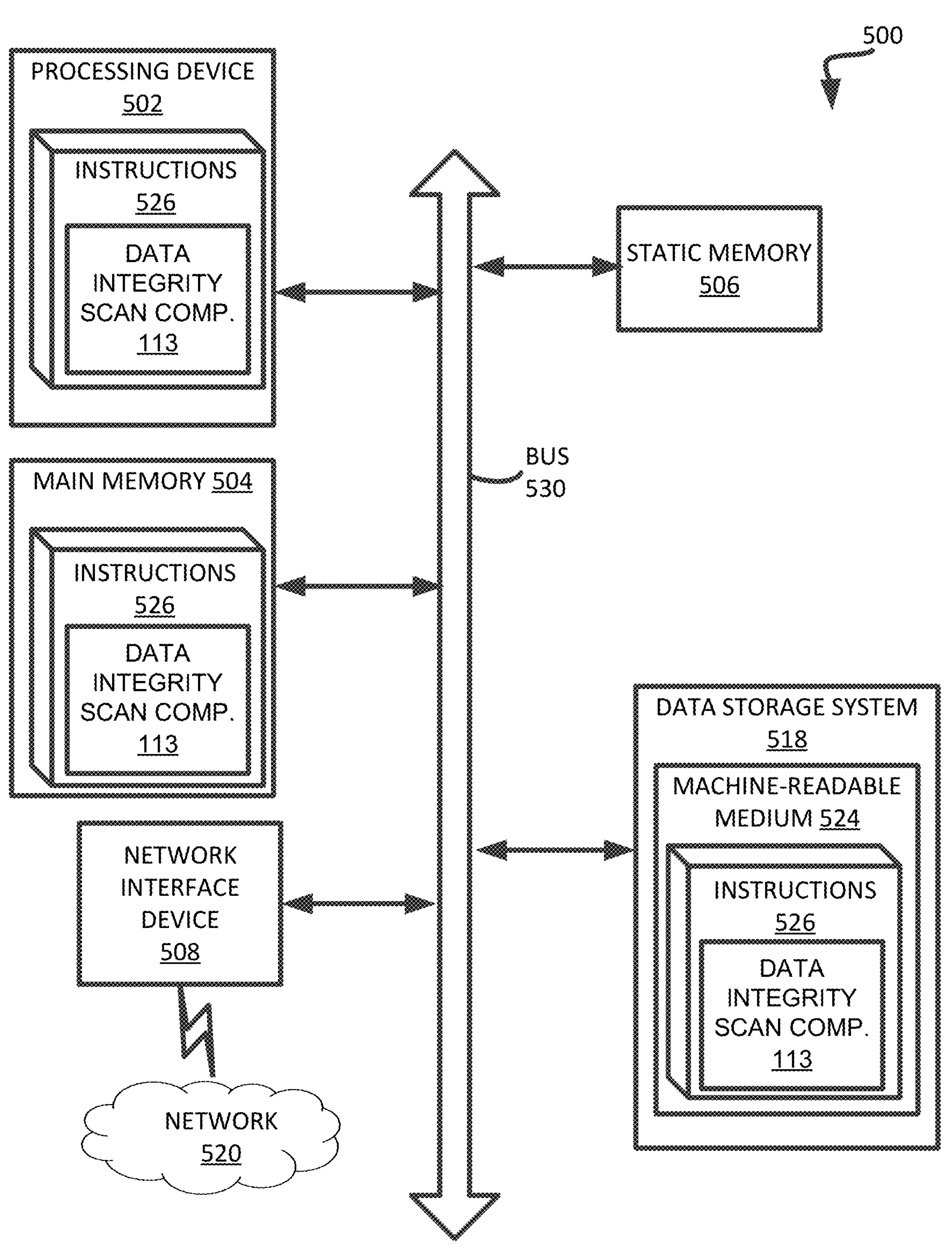
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data integrity scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the data integrity scan component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
- a memory device;
- a processing device, operatively coupled with the memory device, to perform operations comprising:
  - performing a first data integrity scan on a block of the memory device to determine a first combined reliability statistic of memory cells in the block associated with a first program level and a second program level;
  - performing, using a predetermined read level offset corresponding to one of the first program level or the second program level, a second data integrity scan on the block of the memory device to determine a second combined reliability statistic of the memory cells in the block associated with the first program level and the second program level, wherein performing the second data integrity scan comprises applying a modified first read voltage to memory cells corresponding to the first program level and applying an unmodified second read voltage to memory cells corresponding to the second program level;
  - determining a difference between the first combined reliability statistic and the second combined reliability statistic, wherein the difference is attributable to the first program level; and
  - responsive to the difference between the first combined reliability statistic and the second combined reliability statistic satisfying a threshold criterion, performing a corrective action on the block of the memory device.

2. The system of claim 1, wherein the processing device is to perform operations further comprising:
- detecting an occurrence of a data integrity check trigger event; and
- performing the first data integrity scan responsive to the occurrence of the data integrity check trigger event.

3. The system of claim 1, wherein the first data integrity scan is performed using default read voltages corresponding to the first program level and the second program level, and wherein the first data integrity scan comprises at least one of a lower-page read operation or an extra-page read operation.

4. The system of claim 1, wherein the processing device is to perform operations further comprising:
- determining whether the first combined reliability statistic satisfies a scan threshold criterion; and
- performing the second data integrity scan responsive to the first combined reliability statistic satisfying the scan threshold criterion.

5. The system of claim 1, wherein performing the second data integrity scan comprises:
- applying the modified first read voltage to memory cells corresponding to the first program level, wherein the modified first read voltage comprises a first read voltage applied during the first data integrity scan modified by the predetermined read level offset; and
- applying the unmodified second read voltage to memory cells corresponding to the second program level, wherein the unmodified second read voltage comprises a same read voltage applied during the first data integrity scan.

6. The system of claim 1, wherein the first data integrity scan and the second data integrity scan comprise read disturb scans, and wherein the corrective action comprises folding data in the block to another block of the memory device.

7. The system of claim 1, wherein the first data integrity scan and the second data integrity scan comprise program completion scans, and wherein the corrective action comprises marking the block for garbage collection and reprogramming data from the block to another block of the memory device.

8. A method comprising:
- performing a first data integrity scan on a block of a memory device to determine a first combined reliability statistic of memory cells in the block associated with a first program level and a second program level;
- performing, using a predetermined read level offset corresponding to one of the first program level or the second program level, a second data integrity scan on the block of the memory device to determine a second combined reliability statistic of the memory cells in the block associated with the first program level and the second program level, wherein performing the second data integrity scan comprises applying a modified first read voltage to memory cells corresponding to the first program level and applying an unmodified second read voltage to memory cells corresponding to the second program level;

determining a difference between the first combined reliability statistic and the second combined reliability statistic, wherein the difference is attributable to the first program level; and responsive to the difference between the first combined reliability statistic and the second combined reliability statistic satisfying a threshold criterion, performing a corrective action on the block of the memory device.

9. The method of claim 8, further comprising:

detecting an occurrence of a data integrity check trigger event; and performing the first data integrity scan responsive to the occurrence of the data integrity check trigger event.

10. The method of claim 8, wherein the first data integrity scan is performed using default read voltages corresponding to the first program level and the second program level, and wherein the first data integrity scan comprises at least one of a lower-page read operation or an extra-page read operation.

11. The method of claim 8, further comprising:

determining whether the first combined reliability statistic satisfies a scan threshold criterion; and performing the second data integrity scan responsive to the first combined reliability statistic satisfying the scan threshold criterion.

12. The method of claim 8, wherein performing the second data integrity scan comprises:

applying the modified first read voltage to memory cells corresponding to the first program level, wherein the modified first read voltage comprises a first read voltage applied during the first data integrity scan modified by the predetermined read level offset; and applying the unmodified second read voltage to memory cells corresponding to the second program level, wherein the unmodified second read voltage comprises a same read voltage applied during the first data integrity scan.

13. The method of claim 8, wherein the first data integrity scan and the second data integrity scan comprise read disturb scans, and wherein the corrective action comprises folding data in the block to another block of the memory device.

14. The method of claim 8, wherein the first data integrity scan and the second data integrity scan comprise program completion scans, and wherein the corrective action comprises marking the block for garbage collection and reprogramming data from the block to another block of the memory device.

15. A non-transitory computer-readable storage medium comprising instructions that, when executed by a processing device, cause the processing device to perform operations comprising:

performing a first data integrity scan on a block of a memory device to determine a first combined reliability statistic of memory cells in the block associated with a first program level and a second program level;

performing, using a predetermined read level offset corresponding to one of the first program level or the second program level, a second data integrity scan on the block of the memory device to determine a second combined reliability statistic of the memory cells in the block associated with the first program level and the second program level, wherein performing the second data integrity scan comprises applying a modified first read voltage to memory cells corresponding to the first program level and applying an unmodified second read voltage to memory cells corresponding to the second program level;

determining a difference between the first combined reliability statistic and the second combined reliability statistic, wherein the difference is attributable to the first program level; and responsive to the difference between the first combined reliability statistic and the second combined reliability statistic satisfying a threshold criterion, performing a corrective action on the block of the memory device.

16. The non-transitory computer-readable storage medium of claim 15, wherein the instructions cause the processing device to perform operations further comprising:

detecting an occurrence of a data integrity check trigger event; and performing the first data integrity scan responsive to the occurrence of the data integrity check trigger event.

17. The non-transitory computer-readable storage medium of claim 15, wherein the first data integrity scan is performed using default read voltages corresponding to the first program level and the second program level, and wherein the first data integrity scan comprises at least one of a lower-page read operation or an extra- page read operation.

18. The non-transitory computer-readable storage medium of claim 15, wherein the instructions cause the processing device to perform operations further comprising:

determining whether the first combined reliability statistic satisfies a scan threshold criterion; and performing the second data integrity scan responsive to the first combined reliability statistic satisfying the scan threshold criterion.

19. The non-transitory computer-readable storage medium of claim 15, wherein performing the second data integrity scan comprises:

applying the modified first read voltage to memory cells corresponding to the first program level, wherein the modified first read voltage comprises a first read voltage applied during the first data integrity scan modified by the predetermined read level offset; and applying the unmodified second read voltage to memory cells corresponding to the second program level, wherein the unmodified second read voltage comprises a same read voltage applied during the first data integrity scan.

20. The non-transitory computer-readable storage medium of claim 15, wherein the first data integrity scan and the second data integrity scan comprise at least one of read disturb scans or program completion scans, and wherein the corrective action comprises at least one of folding data in the block to another block of the memory device or marking the block for garbage collection and reprogramming data from the block to another block of the memory device.

* * * * *